US010565048B2

(12) United States Patent
Cananzi et al.

(10) Patent No.: US 10,565,048 B2
(45) Date of Patent: Feb. 18, 2020

(54) LOGIC BUFFER FOR HITLESS SINGLE EVENT UPSET HANDLING

(71) Applicant: Arista Networks, Inc., Santa Clara, CA (US)

(72) Inventors: David Anthony Cananzi, Sunnyvale, CA (US); Elliott B. Van Hartingsveldt, Sunnyvale, CA (US); Michael Romain, Mountain View, CA (US)

(73) Assignee: Arista Networks, Inc., Santa Clara, CA (US)

(*) Notice: Subject to any disclaimer, the term of this patent is extended or adjusted under 35 U.S.C. 154(b) by 200 days.

(21) Appl. No.: 15/829,542

(22) Filed: Dec. 1, 2017

(65) Prior Publication Data
US 2019/0171508 A1    Jun. 6, 2019

(51) Int. Cl.
*G06F 11/07* (2006.01)
*G11C 7/10* (2006.01)
(Continued)

(52) U.S. Cl.
CPC ........ *G06F 11/079* (2013.01); *G06F 11/0727* (2013.01); *G06F 11/0751* (2013.01);
(Continued)

(58) Field of Classification Search
CPC .. G06F 11/0793; G06F 11/183; G06F 11/184; G06F 11/187; G06F 11/1004;
(Continued)

(56) References Cited

U.S. PATENT DOCUMENTS

| 5,333,274 | A | * | 7/1994 | Amini | G06F 11/00 714/50 |
| 6,034,891 | A | * | 3/2000 | Norman | G11C 16/06 365/185.09 |
| 7,111,224 | B1 | * | 9/2006 | Trimberger | G01R 31/318519 326/38 |
| 7,701,247 | B1 | * | 4/2010 | Nelson | G06F 11/1076 326/38 |

(Continued)

OTHER PUBLICATIONS

Error masking method based on the short-duration offline test by Jan Belohoubek, Petr Fiser, Jan Schmidt published Jun. 9, 2017 https://www.sciencedirect.com/science/article/pii/S0141933117300339 (Year: 2017).*

*Primary Examiner* — Joseph O Schell
(74) *Attorney, Agent, or Firm* — Chamberlain, Hrdlicka, White, Williams & Aughtry (57) ABSTRACT

Methods and systems for handling a single event upset. The methods include, and/or the systems include functionality for, receiving, from a monitored device, data at a first input of an initial state change device; detecting, based on receiving the data, a state change; asserting, based on detecting the state change, an initial state change device enable signal; transferring the first data from the first input to a first output of the initial state change device (which may be operatively connected to a second input of a state hold device); triggering, based on detecting the state change, a delay counter; making a determination that the delay period counted by the delay counter expired without receipt of an error detection signal; and based on the determination, asserting a state hold device enable signal to allow the data to pass from the second input to a second output of the state hold device.

21 Claims, 5 Drawing Sheets

(51) Int. Cl.
    *G11C 5/00*    (2006.01)
    *G06F 11/18*   (2006.01)
    *G11C 29/52*   (2006.01)

(52) U.S. Cl.
    CPC ...... *G06F 11/0772* (2013.01); *G06F 11/0793* (2013.01); *G06F 11/0766* (2013.01); *G06F 11/183* (2013.01); *G11C 5/005* (2013.01); *G11C 7/1006* (2013.01); *G11C 29/52* (2013.01)

(58) Field of Classification Search
    CPC .. G06F 11/1008; G06F 11/16; G06F 11/1695; G06F 11/1608; G06F 11/1629; G06F 11/0727; G06F 11/0736; G06F 11/0751; G06F 11/0766; G06F 11/0772; G11C 11/4125; G11C 29/52; G11C 5/005; G11C 7/1006; H03K 19/0033
    See application file for complete search history.

(56) References Cited

U.S. PATENT DOCUMENTS

| | | | |
|---|---|---|---|
| 2003/0135640 A1* | 7/2003 | Ho | H04L 1/1621 709/237 |
| 2004/0128602 A1* | 7/2004 | Lyons | G06F 13/4243 714/736 |
| 2006/0018171 A1* | 1/2006 | Austin | G06F 9/3861 365/205 |
| 2006/0280002 A1* | 12/2006 | Bull | G06F 9/3869 365/189.07 |
| 2010/0158514 A1* | 6/2010 | Azumi | H04J 3/14 398/17 |
| 2011/0107166 A1* | 5/2011 | Flautner | G06F 11/1604 714/746 |
| 2014/0376295 A1* | 12/2014 | Oh | G11C 29/52 365/51 |
| 2018/0191431 A1* | 7/2018 | Moision | H04L 1/1874 |

* cited by examiner

LOGIC BUFFER FOR HITLESS SINGLE EVENT UPSET HANDLING

BACKGROUND

Electronic devices that include certain types of data storage elements (e.g., static random access memory (SRAM)) may be susceptible to unexpected state changes. For example, a particle (e.g., ion, electron, photon, etc.) may cause a single event upset (SEU) when striking a portion of SRAM of a device, which may cause the value of a logical bit to change (e.g., from a 0 to a 1). Such unexpected state changes may alter the expected logical operation of a device, which may cause the device to malfunction in some way.

SUMMARY

In general, in one aspect, the invention related to a method for handling a single event upset (SEU). In one or more embodiments of the invention, the method includes receiving, from a monitored device, a first data at a first input of an initial state change device; detecting, based on receiving the first data, a first state change; and asserting, based on detecting the first state change, an initial state change device enable signal. In one or more embodiments of the invention, the method also includes transferring the first data from the first input to a first output of the initial state change device. In one or more embodiments of the invention, the first output is operatively connected to a second input of a state hold device. In one or more embodiments of the invention, the method also includes triggering, based on detecting the first state change, a delay counter to count a delay period; making, by a validation engine, a first determination that the delay period counted by the delay counter has expired without receipt of an error detection signal; and based on the first determination, asserting a state hold device enable signal to allow the first data to pass from the second input to a second output of the state hold device.

In general, in one aspect, the invention related to a system for handling a single event upset (SEU). In one or more embodiments of the invention, the system includes a monitored device comprising static random access memory (SRAM) that includes stored logic. In one or more embodiments of the invention, the system also includes an initial state change device operatively connected to the monitored device. In one or more embodiments of the invention, the initial state change device includes a first input and a first output, and is configured to receive a first data from the monitored device at the first input. In one or more embodiments of the invention, the system also includes a state hold device that includes a second input and a second output. In one or more embodiments of the invention, the second input is operatively connected to the first output. In one or more embodiments of the invention, the system also includes a delay counter configured to count a delay period, and the state comparator operatively connected to the first input, the initial state change device enable input of the initial state change device, and the delay counter. In one or more embodiments of the invention, the state comparator is configured to detect, based receiving the first data, a first state change; assert, based on detecting the first state change, an initial state change device enable signal for the initial state change device to transfer the first data from the first input to the first output; and trigger, based on detecting the first state change, the delay counter to count the delay period. In one or more embodiments of the invention, the system also includes a validation engine operatively connected to the monitored device, the delay counter, and the state hold device. In one or more embodiments of the invention, the validation engine is configured to make a first determination that the delay period counted by the delay counter expired without receipt, b the validation engine, of an error detection signal from the monitored device; and based on the first determination that no error detection signal was received during the delay period, assert a state hold device enable signal to allow the first data to pass from the second input to the second output of the state hold device.

In general, in one aspect, the invention related to a system for handling a single event upset (SEU). In one or more embodiments of the invention, the system includes a monitored device that includes static random access memory (SRAM) including stored logic. In one or more embodiments of the invention, the system also includes an initial state change device operatively connected to the monitored device. In one or more embodiments of the invention, the initial state change device includes a first input and a first output, and is configured to receive a first data from the monitored device at the first input. In one or more embodiments of the invention, the system also includes a state hold device that includes a second input and a second output. In one or more embodiments of the invention, the second input is operatively connected to the first output. In one or more embodiments of the invention, the system also includes a delay counter configured to receive a first load signal from the monitored device when a first state change occurs; and count a delay period after receiving the first load signal. In one or more embodiments of the invention, the system also includes a validation engine operatively connected to the monitored device, the delay counter, and the state hold device. In one or more embodiments of the invention, the validation engine is configured to make a first determination that the delay period counted by the delay counter expired without receipt, by the validation engine, of an error detection signal from the monitored device; and based on the first determination, assert a state hold device enable signal to allow the first data to pass from the second input to the second output of the state hold device.

Other aspects of the invention will be apparent from the following description and the appended claims.

DETAILED DESCRIPTION

Specific embodiments will now be described with reference to the accompanying figures. In the following description, numerous details are set forth as examples of the invention. It will be understood by those skilled in the art, and having the benefit of this Detailed Description, that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components, Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention relate to a system and method for validating state changes of a monitored device using an error detection signal and various circuit components. Specifically, in one or more embodiments of the invention, when a state change of a device is detected, a delay counter starts counting a delay period during which the previous state output of the monitored device is held, and the device for which the state change is detected is monitored to determine whether an error detection signal occurs during the delay period. Examples of a detected state change include, but are not limited to, a change in one or more signals from a monitored device, a certain number of bits being transferred into a shift register from the monitored device, etc.

In one or more embodiments of the invention, if no error detection signal is received during the delay period, the previous state is enabled to change to the new state and propagated to other devices (e.g., other components of a network device). In one or more embodiments of the invention, if an error detection signal is received during the delay period, the previous state is held, the new state is not propagated to other devices, and an alert is sent to an appropriate entity (e.g., a processor of a network device) notifying the entity of the received error detection signal.

Figure 1:
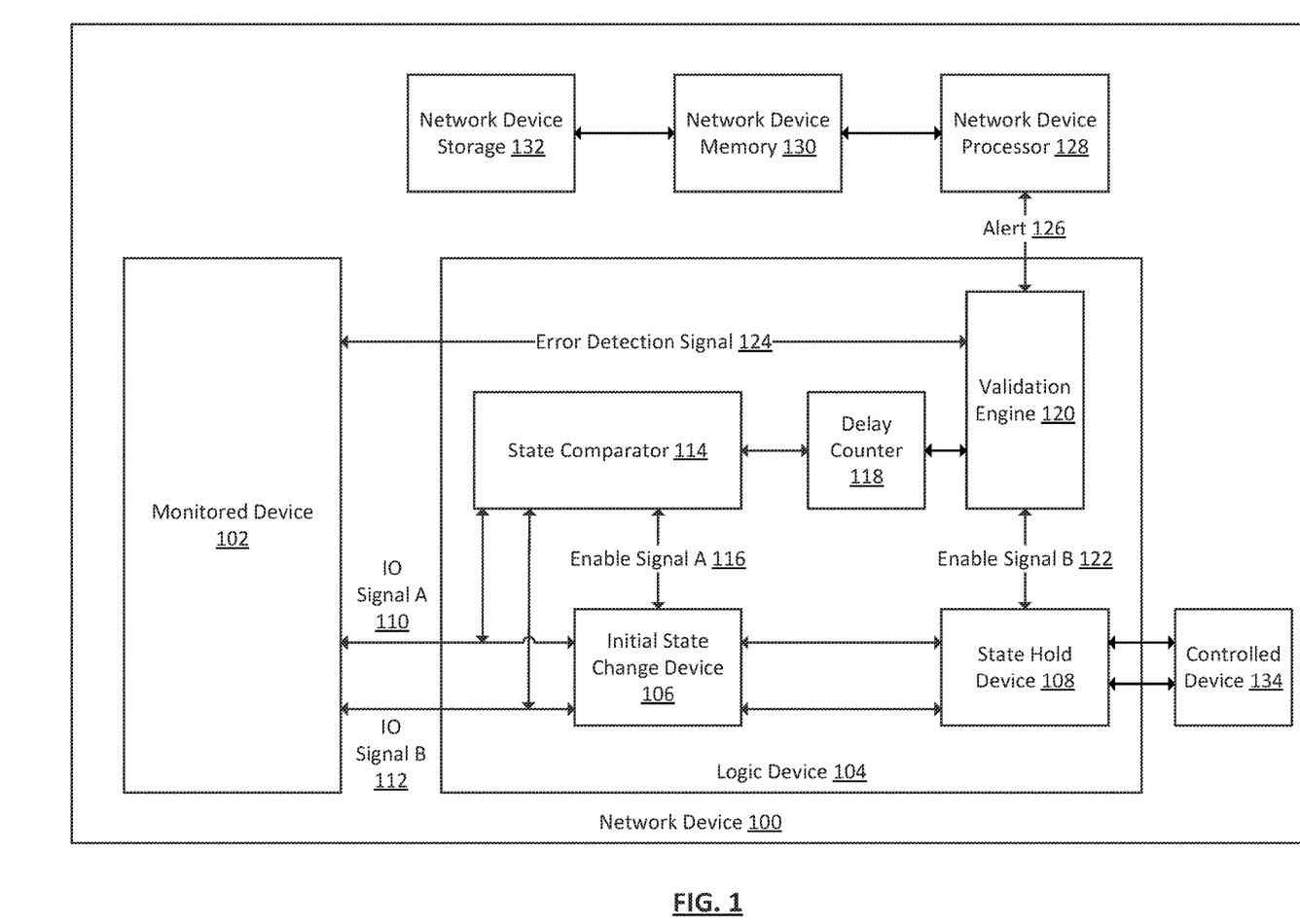
FIG. 1 shows a system in accordance with one or more embodiments of the invention.

FIG. 1 shows a system in accordance with one or more embodiments of the invention. As shown in FIG. 1, the system includes a network device (100). The network device (100) may include a monitored device (102), a logic device (104), a controlled device (134), a network device processor (128), a network device memory (130), and a network device storage (132). The logic device (104) may include an initial state change device (106), a state hold device (108), a state comparator (114), a delay counter (118), and a validation engine (120). Each of these components is described below.

In one or more embodiments of the invention, a network device (100) may be a physical device that includes persistent storage (e.g., network device storage (132)), memory (e.g., random access memory (RAM), shared memory) (e.g., network device memory (130)), one or more processor(s) (e.g., integrated circuits such as, for example, a switch chip (not shown), a network data unit processor (not shown and/or network device processor (128)), and two or more physical network interfaces or ports (not shown). The switch chip (e.g., an application specific integrated circuit (ASIC)) or network data unit processor may be hardware that determines out of which egress port on the network device (100) to forward data units such as, for example, media access control (MAC) frames that may include Internet Protocol (IP) packets. The switch chip or network data unit processor may include egress and ingress ports that may connect to physical network interfaces or ports on the network device (100). Further, each physical network interface or port may or may not be connected to another component (e.g., a computing device (not shown)) or to another network device (not shown) in a network (not shown).

A network device (100) may be configured to receive data units via the network interfaces or ports, and determine whether to: (i) drop the data unit; (ii) process the data unit in accordance with one or more embodiments of the invention; and/or (iii) send the data unit, based on the processing, out another network interface or port on the network device (100) in accordance with one or more embodiments of the invention.

In one or more embodiments of the invention, the network device (100) may also include software and/or firmware stored in the network device storage (132) and/or the network device memory (130) that include instructions which, when executed by the network device processor (128), cause the network device processor to perform operations in accordance with one or more embodiments of the invention. As a non-limiting example, the network device processor (128) may include functionality to receive alerts (e.g., alert (126)) from various elements of the network device (e.g., a validation engine (120), described below) and process the alert (126) based on software instructions stored in the network device storage (132) and/or the network device memory (130). The functionally of a network device (100) is not limited to the aforementioned examples. Examples of a network device (100) include, but are not limited to, a switch, a router, and a multilayer switch. A network device (100) is not limited to the aforementioned specific examples. One having ordinary skill in the art, and the benefit of this Detailed Description, will appreciate that embodiments described herein may or may not be in the context of a network device, and may instead be implemented for any monitored device controlling a controlled device where the monitored device may be susceptible to SEUs.

In one or more embodiments of the invention, a network device (100) includes a monitored device (102). In one or more embodiments of the invention, the monitored device (102) includes hardware (e.g., circuitry) and programmed logic stored in data storage (not shown) of the monitored device (102). For example, logic may be stored in one or more types of SRAM included M the monitored device, such as block RAM and/or configuration RAM. Examples of a monitored device (102) include, but are not limited to, a field programmable gate array (FPGA), a complex programmable logic device (CPLD), a microcontroller, other devices types with memory capable of being programmed with device logic for performing various operations, and/or any combinations thereof. Though FIG. 1 shows an embodiment of the invention that includes one monitored device (102), a network device (100) may include any number of monitored devices without departing from the scope of the invention.

In one or more embodiments of the invention, a monitored device (102) is any device that includes a form of data storage (e.g., SRAM) (not shown) that is susceptible to unexpected state changes caused by single event upsets (SEUs). In one or more embodiments of the invention, a SEU is a state change caused by the collision of a particle with a sensitive portion (e.g., memory such as SRAM) of a monitored device. SEUs may be caused by various particles, such as ions, electrons, photons, etc., that may be considered energetic. Such particles may, for example, result from radiation, cosmic rays, etc. On occasion, such particles may collide with susceptible portions of a monitored device (e.g., the SRAM) and cause an unexpected change in the state and/or operation of the monitored device.

In one or more embodiments of the invention, a monitored device (102) includes functionality to control the operation of one or more other components of a network device (100), which may be referred to as controlled devices (134). As an example of controlled devices (134), a network device (100) may include any number of light emitting diodes (LEDs) that provide information to an observer via the presence, color, or changing character of emitted light, which may be controlled by a monitored device (102). As another example, a network device (100) may include any number of optical transceivers for network device interfaces that may be reset based on a state output by a monitored device (102). Similarly, as another example, a network device (100) may include any number of network device chips (e.g., switch chips) for processing incoming and/or outgoing data units (e.g., packets, frames, etc.), and the reset function of one or more such network device chips may be controlled by a monitored device (102). Types of controlled devices (134) are not limited to the preceding examples.

In one or more embodiments of the invention, a monitored device includes functionality to output one or more signals (e.g., input-output (TO) signal A (110), IO signal B (112)), and the one or more signals may represent a state output by the monitored device (102). Though FIG. 1 shows an embodiment of the invention in which a monitored device (102) outputs two such signals, a monitored device (102) may output any number of signals without departing from the scope of the invention. In one or more embodiments of the invention, signals (e.g., TO signal A (110), IO signal B (112)) serve to control, at least in part, some aspect of the operation and/or state of one or more controlled devices to which the monitored device is operatively connected (e.g., via connections to and from a logic device (104)).

In one or more embodiments of the invention, a monitored device (102) also includes functionality to perform error detection and, if an error is detected, output an error detection signal (124). In one or more embodiments of the invention, an error detection signal is any signal that indicates that a monitored device (102) has experienced an error (e.g., a fatal error). One non-limiting example of such an error detection signal (124) is a cyclic redundancy check (CRC) signal. In one or more embodiments of the invention, a CRC signal is a signal that is asserted (i.e., output from a monitored device) when an error is detected in the logic of the monitored device (102). For example, a CRC may loop through the contents of stored logic (e.g., logic stored in SRAM) of a monitored device (102), performing a validation that the values included therein match expected values (e.g., by performing some mathematical operation on the data and comparing the result with an expected result of performing the operation on the data).

In one or more embodiments of the invention, the CRC loop through the logic of a monitored device (102) takes some amount of time, and, if an error is encountered, a CRC signal indicating the detected error (e.g., the error detection signal (124)) is not asserted until the loop has completed. In such embodiments, during the time between when the error occurs, and when the error detection signal (124) (e.g., the CRC signal) is asserted, the monitored device (102) may be outputting an unexpected and/or unintended state, which may cause unintended actions or operation of one or more controlled devices that the monitored device is intended to control. For example, if the monitored device (102) is controlling the reset functionality of a switch chip (e.g., a controlled device (134)), then one or more unintended signals (e.g., IO signal A (110), 10 signal B (112)) being output from the monitored device may cause the switch chip to unexpectedly reset, thereby causing a potential drop of network traffic that is being processed by the switch chip.

In one or more embodiments of the invention, the monitored device (102) is operatively connected to a logic device (104). In one or more embodiments of the invention, a logic device (104) is any device that includes hardware components (e.g., circuitry) capable of receiving one or more signals (e.g., 10 signal A (110), TO signal B (112)) from a monitored device (102), holding a state represented by the signals for some period of time (e.g., a delay period), and outputting the one or more signals to a controlled device (134).

In one or more embodiments of the invention, the logic device (104) includes functionality to hold a previous state output from a monitored device (102) for a delay period once a state change (i.e., a change in the one or more signals (e.g., IO signal A (110), IO signal B (112)) output from the monitored device) is detected in order to determine whether the monitored device has experienced an error (e.g., an SEU). In such embodiments, the new detected state is not propagated to a controlled device (134) until the delay period ends without the receipt of an error detection signal (124) output from the monitored device (102). If, on the other hand, an error is detected via receipt of an error detection signal (124) from a monitored device during a delay period, an alert (126) may be sent to a network device processor (128). Although FIG. 1 shows a single logic device (104), a network device may include any number of logic devices, each monitoring any number of monitored devices, without departing from the scope of the invention.

In one or more embodiments of the invention, the logic device (104) includes one or more state comparators (114). In one or more embodiments of the invention, a state comparator (114) is any hardware (e.g., circuitry) that is operatively connected to a monitored device (102), and includes functionality to receive one or more signals (e.g., IO signal A (110), IO signal B (112)) from the monitored device (102). In one or more embodiments of the invention, when any of the one or more signals (e.g., IO signal A (110), IO signal B (112)) change in value (e.g., transition from 0 to 1, transition from a higher voltage to a lower voltage, etc.), then a state change has occurred, and is detected by the state comparator (114). For example, the state comparator (114) may compare a currently detected state to a previously detected state to determine if a change has occurred. Although FIG. 1 shows a single state comparator (114), a network device may include any number of state comparators without departing from the scope of the invention.

In one or more embodiments of the invention, the state comparator (114) is operatively connected to an initial state change device (106) and includes functionality to send an enable signal A (116) to the initial state change device (106). In one or more embodiments of the invention, the initial state change device (106) includes hardware (e.g., circuitry) and includes functionality to receive one or more signals (e.g., IO signal A (110), IO signal B (112)) from a monitored device and, when enable signal A (116) is sent from a state comparator (114), propagate the one or more signals from one or more inputs of the initial state change device (106) to one or more outputs of the initial state change device (106).

A non-limiting example of an initial state change device (106) is a latch (i.e., a flip-flop). As used herein, a latch is a circuit component that includes functionality to receive signals at inputs and, when an enable signal is received (e.g., from a state comparator), to propagate the received signals to outputs of the latch. In one or more embodiments of the invention, the initial state change device (106) receives an enable signal A (116) from a state comparator only after the state comparator (114) detects a state change from a monitored device (102), thereby causing the initial state change device (106) to propagate the changed state from the one or more inputs of the initial state change device (106) to the one or more outputs of the initial state change device (106). Although FIG. 1 shows a single initial state change device (106), a network device may include any number of initial state change devices without departing from the scope of the invention.

In one or more embodiments of the invention, the state comparator (114) is also operatively connected to a delay counter (118) and includes functionality to cause the delay counter (118) to begin counting a delay period when a state change is detected from a monitored device (102), In one or more embodiments of the invention, a delay counter is any hardware (e.g., circuitry) capable of measuring (i.e., counting) a period of time. The amount of time that a delay counter (118) counts may be pre-configured (e.g., a function of the circuitry of the delay counter) and/or configurable by an entity such as a user, other element of a network device (100), network device software, etc. In one or more embodiments of the invention, the delay counter (118) includes functionality to count a delay period that is similar to or greater than twice the amount of time that it takes for a monitored device (102) to perform an error check (e.g., a full loop of a CRC of the logic stored in the SRAM of a monitored device). Such a delay period (e.g., 200 milliseconds) may adhere to the Nyquist-Shannon sampling theorem. Although FIG. 1 shows a single delay counter (118), a network device (100) may include any number of delay counters without departing from the scope of the invention.

In one or more embodiments of the invention, the delay counter (118) is operatively connected to a validation engine (120), which is also operatively connected to a monitored device (102), In one or more embodiments of the invention, a validation engine (120) is any hardware (e.g., circuitry) capable of receiving an indication from a delay counter (118) that a delay period has begun and subsequently ended, and to determine if any error detection signal (124) was received from a monitored device (102) during the aforementioned delay period. In one or more embodiments of the invention; if an error detection signal (124) is received from a monitored device (102) during a delay period, the validation engine (120) includes functionality to send an alert (126) (e.g., an interrupt) to an appropriate entity, such as, for example, a network device processor (128). Although FIG. 1 shows a single validation engine (120), a network device (100) may include any number of validation engines without departing from the scope of the invention.

In one or more embodiments of the invention, a validation engine (120) is also operatively connected to a state hold device (108) and includes functionality to send an enable signal B (122) to the state hold device (108) when a delay period has been counted and passed without the validation engine (120) receiving an error detection signal (124) from a monitored device (102). In one or more embodiments of the invention, a state hold device (108) is any device that includes hardware (e.g., circuitry) and includes functionality to receive one or more signals (e.g., IO signal A (110), IO signal B (112)) from one or more outputs of an initial state change device (106) and, when enable signal B (122) is sent from a validation engine (120), to propagate the one or more signals from one or more inputs of the state hold device (108) to one or more outputs of the state hold device (108). A non-limiting example of a state hold device (108) is a second latch (i.e., a flip-flop) (described above).

In one or more embodiments of the invention, the state hold device (108) receives an enable signal B (122) from a validation engine (120) only after the validation engine (120) determines that no error detection signal (124) was received from a monitored device (102) during a delay period (i.e., counted by a delay counter (118)), thereby causing the state hold device (108) to propagate the changed state from the one or more inputs of the state hold device (108) to the one or more outputs of the state hold device (108). In one or more embodiments of the invention, the one or more outputs of the state hold device (108) are operatively connected to one or more controlled devices (134), and propagating a state change to one or more controlled devices may cause the state or operation of the one or more controlled devices to change (e.g., an LED blinks, a transceiver resets, etc.). In one or more embodiments of the invention, a state hold device holds a previous state received from a monitored device until enable signal B is received. Although FIG. 1 shows a single state hold device, a network device may include any number of state hold devices without departing from the scope of the invention.

While FIG. 1 shows a configuration of components, other configurations may be used without departing from the scope of the invention. For example, various components may be combined to create a single component. As another example, the functionality performed by a single component may be performed by two or more components. Accordingly, embodiments disclosed herein should not be limited to the configuration of components shown in FIG. 1.

Figure 2:
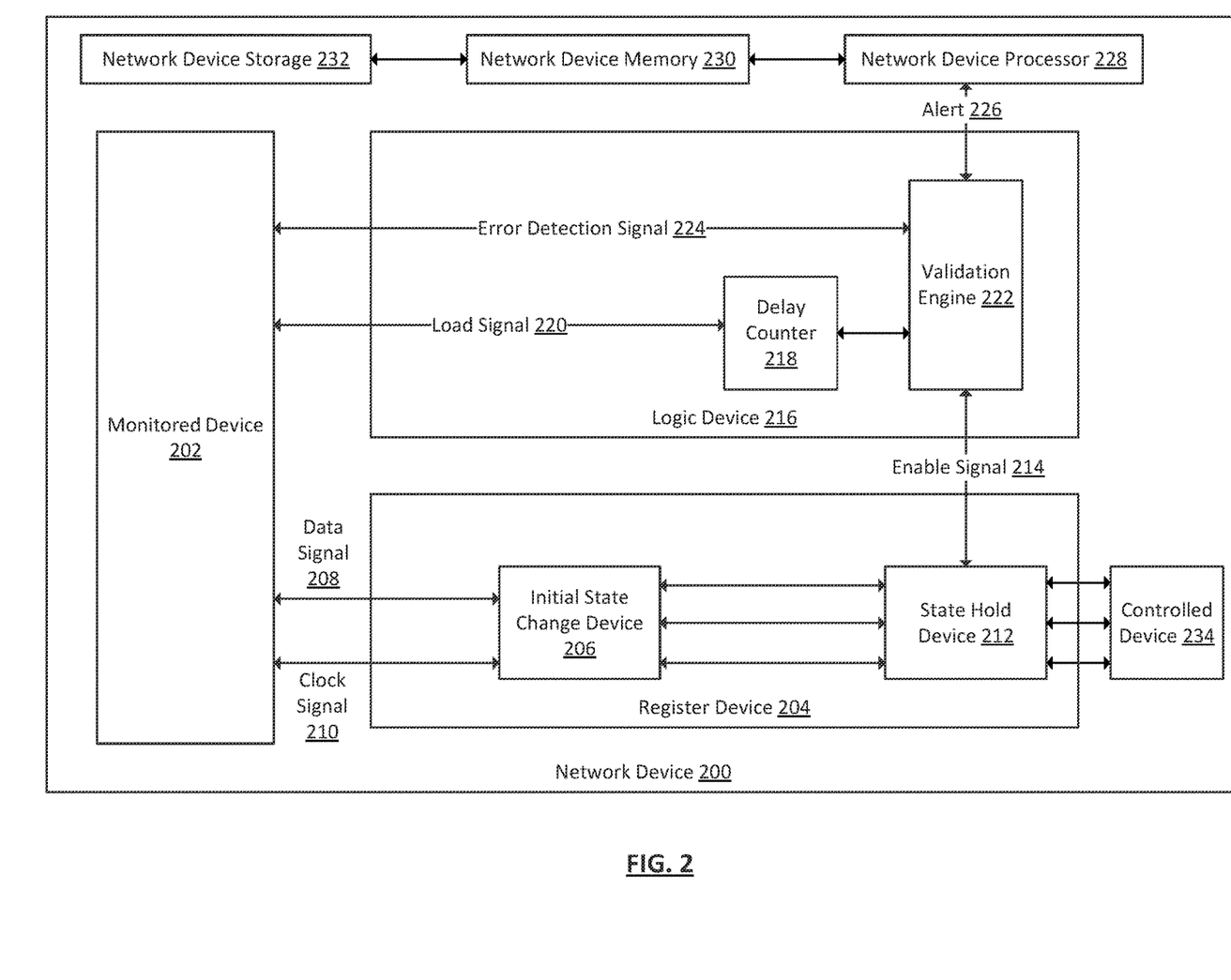
FIG. 2 shows a system in accordance with one or more embodiments of the invention.

FIG. 2 shows a system in accordance with one or more embodiments of the invention. As shown in FIG. 2, the system includes a network device (200). The network device (200) may include a monitored device (202), a logic device (216), a register device (204), a controlled device (234), a network device processor (228), a network device memory (230), and a network device storage (232). The logic device (216) may include a delay counter (218) and a validation engine (222). The register device (204) may include an initial state change device (206) and a state hold device (212). Each of these components is described below.

In one or more embodiments of the invention, the network device (200), the monitored device (202), the network device processor (228), the network device memory (230), the network device storage (232), and the controlled device (234) are substantially similar to like-named components of FIG. 1, which are described above. These components, to avoid unnecessarily complicating the description of FIG. 2, are not re-described in the description of FIG. 2 except where such components may interact with the elements of the register device (204) and/or the logic device (216).

In one or more embodiments of the invention, the monitored device (202) is operatively connected to a register device (204), and includes functionality to transmit a data signal (208) to an initial state change device (206) of the register device (204) based, at least in part, on a clock signal (210). In one or more embodiments of the invention, the initial state change device (206) includes hardware (e.g., circuitry) and includes functionality to have data shifted in to the initial state change device (206) via a data signal (208). For example, the initial state change device (206) may be a shift register that receives a unit of data (e.g., a bit) from a monitored device (202) at each edge of a clock signal (210). In one or more embodiments of the invention, once a certain number of data units e.g., eight bits) have been transferred from a monitored device (202) to an initial state change device (206) (e.g., after eight clock cycles of the clock signal (210)), the monitored device (202) may assert a load signal (220) and transfer the received data to one or more outputs of the initial state change device (206) (which may be referred to as a state change). A load signal (220), as used herein, is a signal that, when asserted, causes the initial state change device (206) to transfer its contents the data that was shifted in) to one or more inputs of a state hold device (212) (described below). As such, a load signal may be referred to as an initial state change device enable signal or, simply, an enable signal. As shown in the embodiment of FIG. 2, the load signal (220) of FIG. 2 is first sent to a delay counter (218) (described below).

In one or more embodiments of the invention, the monitored device (202) is also operatively connected to a logic device (216). In one or more embodiments of the invention, a logic device includes hardware (e.g., circuitry) and includes functionality to receive a load signal (220) from a monitored device (202), count a delay period, and determine if an error detection signal (224) was received from a monitored device (202) during the delay period. The logic device (216) may also include functionality to, when an error detection signal (224) is received during a delay period, send an alert (226) (e.g., an interrupt) to an appropriate entity, such as a network device processor (228). A logic device (216) may also include functionality to, when an error detection signal (224) is not received from a monitored device (202) during a delay period, send an enable signal (214) to a state hold device (212) of the register device (204).

In one or more embodiments of the invention, the logic device (216) includes a delay counter (218). In one or more embodiments of the invention, a delay counter (218) includes hardware (e.g., circuitry) and includes functionality to count a delay period. The delay period may be pre-configured and/or configurable (e.g., the delay period may be twice the time taken by a monitored device to perform one loop through stored logic to detect possible errors therein). In one or more embodiments of the invention, the delay counter (218) is operatively connected to a monitored device (202) and a validation engine (222). In one or more embodiments of the invention, the delay counter (218) begins counting a delay period when a load signal (220) is received from a monitored device (202), indicating that a state change has occurred (i.e., a certain number of data units have been transferred from the monitored device to an initial state change device (206)). In one or more embodiments of the invention, the delay counter (218) includes functionality to provide an indication to a validation engine (222) that a delay period count has started, and, later, that it has subsequently ended.

In one or more embodiments of the invention, the logic device (216) also includes a validation engine (222). In one or more embodiments of the invention, a validation engine (222) includes hardware (e.g., circuitry), and includes functionality to determine whether an error detection signal (224) is received during a delay period counted by a delay counter (218). In one or more embodiments of the invention, if such an error detection signal (224) is received, the validation engine (222) includes functionality to send an alert to a network device processor (228). In one or more embodiments of the invention, if no error detection signal (224) is received by the validation engine (222) during the delay period, then the validation engine (222) includes functionality to send an enable signal (214) to a state hold device (212).

In one or more embodiments of the invention, the register device (204) also includes a state hold device (212). In one or more embodiments of the invention, the state hold device (212) is a storage register that holds the state previously output from a monitored device (202) and received via one or more outputs of an initial state change device (206). In one or more embodiments of the invention, one or more inputs of the state hold device (212) are operatively connected to one or more outputs of an initial state change device (206), and any signals received from the initial state change device (206) are not propagated to one or more outputs of the state hold device (212) unless an enable signal (214) is received from a validation engine (222). In one or more embodiments of the invention, the one or more outputs of the state hold device (212) are operatively connected to one or more controlled devices (234), and may control the state and/or operation of the one or more controlled devices.

While FIG. 2 shows a configuration of components, other configurations may be used without departing from the scope of the invention. For example, various components may be combined to create a single component. As another example, the functionality performed by a single component may be performed by two or more components. Accordingly, embodiments disclosed herein should not be limited to the configuration of components shown in FIG. 2.

Figure 3:
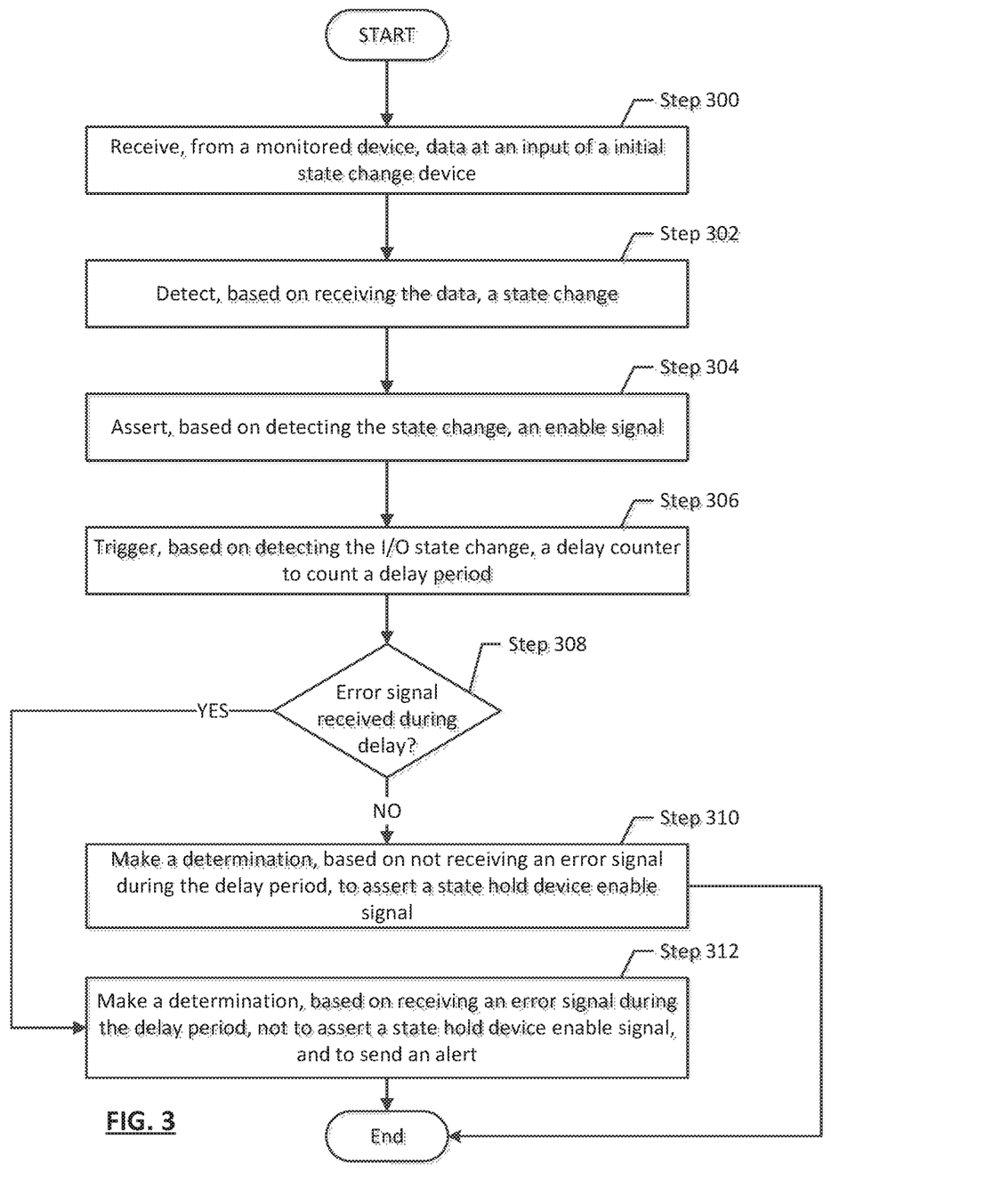
FIG. 3 shows a flowchart in accordance with one or more embodiments of the invention.

FIG. 3 shows a flowchart in accordance with one or more embodiments of the invention. While the various steps in the flowchart are presented and described sequentially, one of ordinary skill in the art and having the benefit of this Detailed Description will appreciate that some or all of the steps may be executed in different orders, may be combined or omitted, and some or all of the steps may be executed in parallel. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention.

FIG. 3 shows a flowchart describing a method for detecting a possible error in the stored logic of a monitored device in accordance with one or more embodiments of the invention.

In Step 300, data is received from a monitored device at an input of an initial state change device. Data may be received as a signal received from one or more operative connections between the monitored device and the initial state change device. As an example, the data may be voltage that changes to represent a logical high (e.g., a "1") and a logical low (e.g., a "0"). There may be any number of such operative connections. As another example, there may be a data line between the monitored device and the initial state change device, and the data may be shifted into the initial state change device (which may be a shift register) at certain clock events (e.g., a clock edge) after which a data unit is shifted in to the shift register, with any amount of shifted-in data being referred to herein as data.

In Step 302, a state change is detected based on receiving the data. In one or more embodiments of the invention, the state change is detected by performing a comparison of the data being received by the initial state change device with previous data received by the initial state change device, with any change in the received data being a state change. For example, if there are two input lines to an initial state change device that are connected to two output lines from a monitored device, each line may, at a given time, be at a logical low (e.g., a state "00" is being received). In the event that one or both of the lines changes to a logical high, such that a state "01", "10", or "11" is being received, then a state change has occurred, and is detected, for example, by a state comparator. As another example, if an initial state change device is a shift register, detection of a state change may occur when a certain number of bits e.g., eight) have shifted into the shift register at relevant times based on a clock signal.

In Step 304, based on detecting a change is state in Step 302, an enable signal is asserted. In one or more embodiments of the invention, assertion of an enable signal causes and/or happens substantially at the same time as an initial state change device transfers received inputs to one or more outputs. As an example, if the initial state change device receives three signal lines from a monitored device at three inputs, and one of the input lines changes, then a state change has occurred. The detection of the state change causes the assertion of an enable signal for the initial state change device, thereby causing the initial state change device to propagate the three signals from the device inputs to outputs of the initial state change device. As another example, in embodiments of the invention in which the initial state change device is a shift register, once a certain number of data units have been transferred to the shift register, the monitored device may assert a load signal (i.e., an enable signal) to a delay counter, and the shift register may include functionality to propagate the received data units to outputs of the shift register once the certain number have been received and the load signal asserted.

In Step 306, based on detection of the state change, a delay counter is triggered to begin counting a delay period. For example, a state comparator may determine that a state change has been received from a monitored device, and, in response to the detection, send an indication to a delay counter to begin counting a delay period. As another example, once a certain number of data units have been transferred to an initial state change device from a monitored device (e.g., a state change), the monitored device may send a load signal to a delay counter, causing the delay counter to begin counting a delay period. In one or more embodiments of the invention, the delay period is a period of time that is long enough to allow the logic of the monitored device to be checked for errors one or more times. For example, in embodiments of the invention in which a monitored device performs CRCs to determine of stored logic of the monitored device has any errors, the delay period may be twice the time to complete a full CRC for the stored logic.

In Step 308, a determination is made about whether an error detection signal was received from a monitored device during the delay period triggered in Step 306. For example, in embodiments of the invention in which the monitored device is an FPGA with functionality to perform CRCs and assert a CRC signal if an error is detected, a validation engine may monitor a CRC signal line during the delay period to determine if the CRC signal asserts during the delay period. In one or more embodiments of the invention, if no error detection signal is received during the delay period, the process proceeds to Step 310. In one or more embodiments of the invention, if an error detection signal is received during the delay period, the process proceeds to Step 312.

In Step 310, based on a determination that an error detection signal was not received during a delay period, an enable signal is sent to a state hold device. In one or more embodiments of the invention, sending an enable signal to a state hold device causes the state hold device to stop holding a previous state, and instead propagate one or more inputs received from an initial state change device to one or more outputs of the state hold device so that the state change from the monitored device is passed to one or more controlled devices. As an example, if the state hold device is a latch, a latch enable signal may be asserted, causing the latch to propagate its input to one or more output lines. As another example, if the state hold device is a storage register, a register enable signal may be asserted, causing the storage register to propagate its input data to the output(s) of the storage register, After Step 310, the process ends.

In Step 312, based on a determination that an error detection signal was received during a delay period, the enable signal is not sent to the state hold device. In one or more embodiments of the invention, not sending an enable signal to the state hold device causes the state hold device to continue holding the previous state, and thus, the one or more controlled devices connected to the one or more outputs of the state hold device remain in the same state (e.g., LED remains green and steady). In one or more embodiments of the invention, determining that an error detection signal was received during the delay period also causes an alert to be sent. For example, a validation engine that was monitoring to determine if a monitored device asserted a CRC during a delay period may, when the CRC is asserted, send an interrupt to a network device processor, which services the interrupt by taking one or more actions related to the alert/interrupt (e.g., perform a logging action, reset/reprogram the monitored device, etc.). After Step 312, the process ends.

Figure 4:
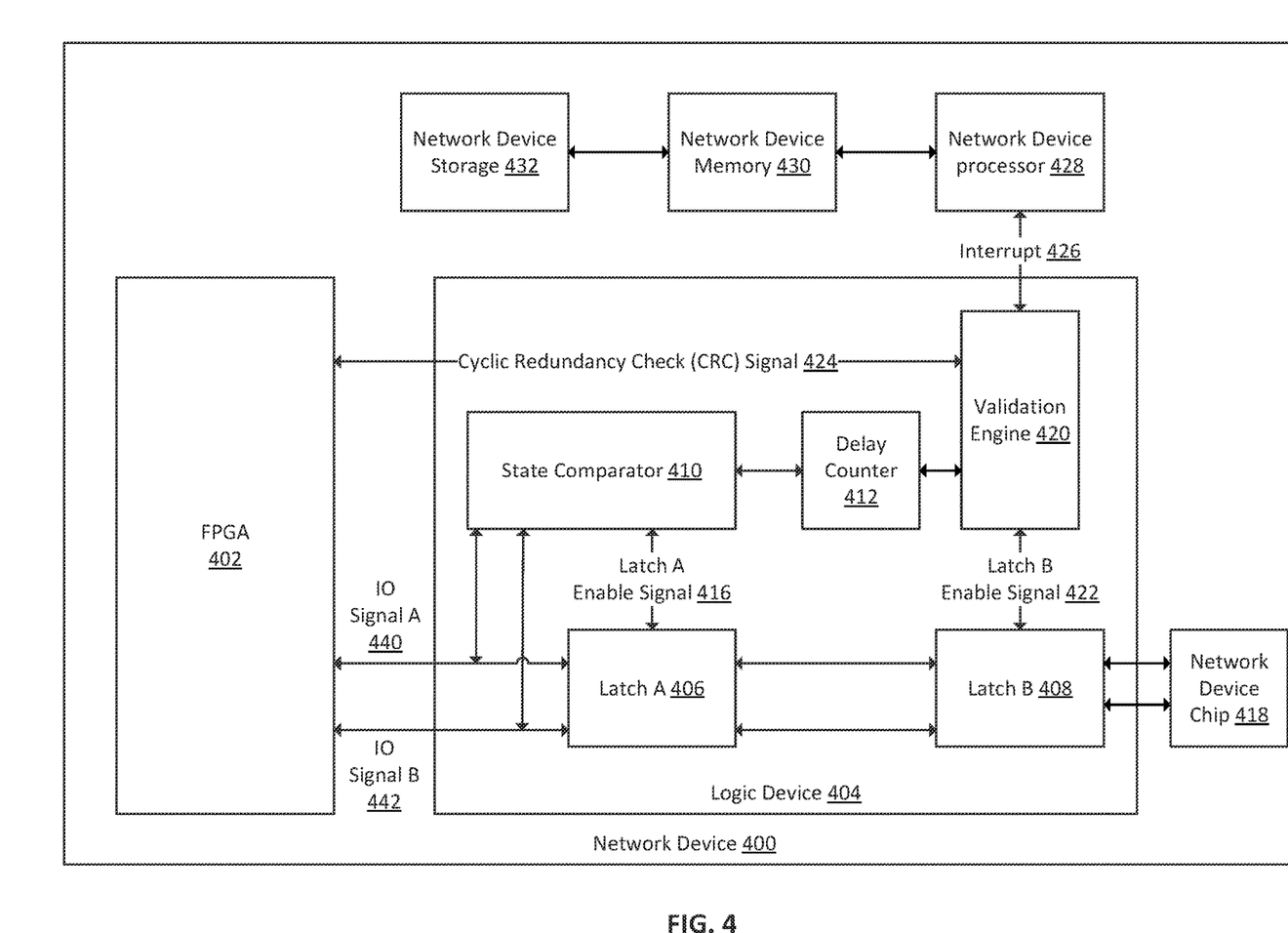
FIG. 4 shows an example in accordance with one or more embodiments of the invention.

FIG. 4 shows an example in accordance with one or more embodiments of the invention. The following example is for explanatory purposes only and not intended to limit the scope of the invention.

Referring to FIG. 4, consider a scenario in which a network device (400) includes an FPGA (402) for controlling a reset function of a network device chip (418). Inserted between the FPGA (402) and the network device chip (418) is a logic device (404). The logic device includes a latch A (406) (i.e., an initial state change device) and a state comparator (410), both of which are coupled to output lines of the FPGA that transmit IO signal A (440) and IO signal B (442). The logic device (404) also includes a delay counter (412), a validation engine (420), and a latch B (408) (i.e., a state hold device). The validation engine (420) is operatively connected to latch B (408) and to a network device processor (428), The network device processor (428) is also operatively connected to network device memory (430) and network device storage (432). Outputs of latch B (408) are coupled to inputs of the network device chip (418).

In such a scenario, the FPGA (402) is configured to output two signals (i.e., IO signal A (440) and IO signal B (442)) for controlling the network device chip (418) reset functionality. The FPGA may cause a reset of the network device chip (418) when both of the signals are sent as a logical high, referred to hereinafter as a 1, making the output state from the FPGA to cause a reset a logical state of 11. At a first time, IO signal A (440) and IO signal B (442) are both at a logical low, referred to hereinafter as a 0, making the state output from the FPGA at the first time a logical state of 00. The logical state of 00 has previously been validated (i.e., no CRC signal was received at the validation engine from the FPGA for a delay period counted by the delay counter and started by the state comparator after the state changed to 00), and thus the state output from latch B (408) to the network device chip (418) is the logical state 00, which will not cause the network device chip to reset.

When both signals change to a 1 (i.e., the state is a logical 11), the signals are propagated to both the state comparator (410) and the two input lines of latch A (406). The state comparator (410) determines that the state output from the FPGA has changed from a 00 to a 11, which is a state change, Based on detecting the state change, the state comparator asserts a latch A enable signal (416) that enables latch A (406) to pass the logical 11 state from its two inputs to its two outputs, which are coupled to the two inputs of latch B (408). Also based on detecting the state change, the state comparator (410) sends an indication to the delay counter (412) to begin counting a delay period that is twice the CRC period of the FPGA.

In turn, the delay counter (412) indicates to the validation engine (420) that a count of a delay period has begun. The validation engine (420) thus monitors for a CRC signal (424) that, if asserted, is received from the FPGA. During the delay period, the state output from latch B (408) to the network device chip remains at logical state 00, meaning state 00 is held (because the latch B enable signal (422) has not yet been asserted), even though the state being received at the inputs of latch B (408) has changed to a logical state 11.

If the delay period passes and no CRC signal (424) is received by the validation engine (420) from the FPGA (402), then the state change has been validated and the latch B enable signal (422) is asserted, causing latch B (408) to propagate the logical state 11 to its outputs and, thus, to the network device chip (418), causing the network device chip to reset, which has been validated as an intended action from the FPGA.

On the other hand, if a CRC signal (424) is received during the delay period (e.g., because an energetic particle has collided with the SRAM of the FPGA), then the state change cannot be validated, the latch B enable signal (422) is not asserted by the validation engine, and, thus, the state output from latch B remains a logical state 00 and the network device chip is not erroneously reset, Additionally, the validation engine (420) sends an interrupt (426) to the network device processor (428), alerting the network device processor that an error has been detected for the FPGA. In response, the network device processor may take any number of actions, such as obtaining the changed state (i.e., 11) from latch A, resetting the FPGA to correct the device logic error that was detected, logging the error, etc.

Figure 5:
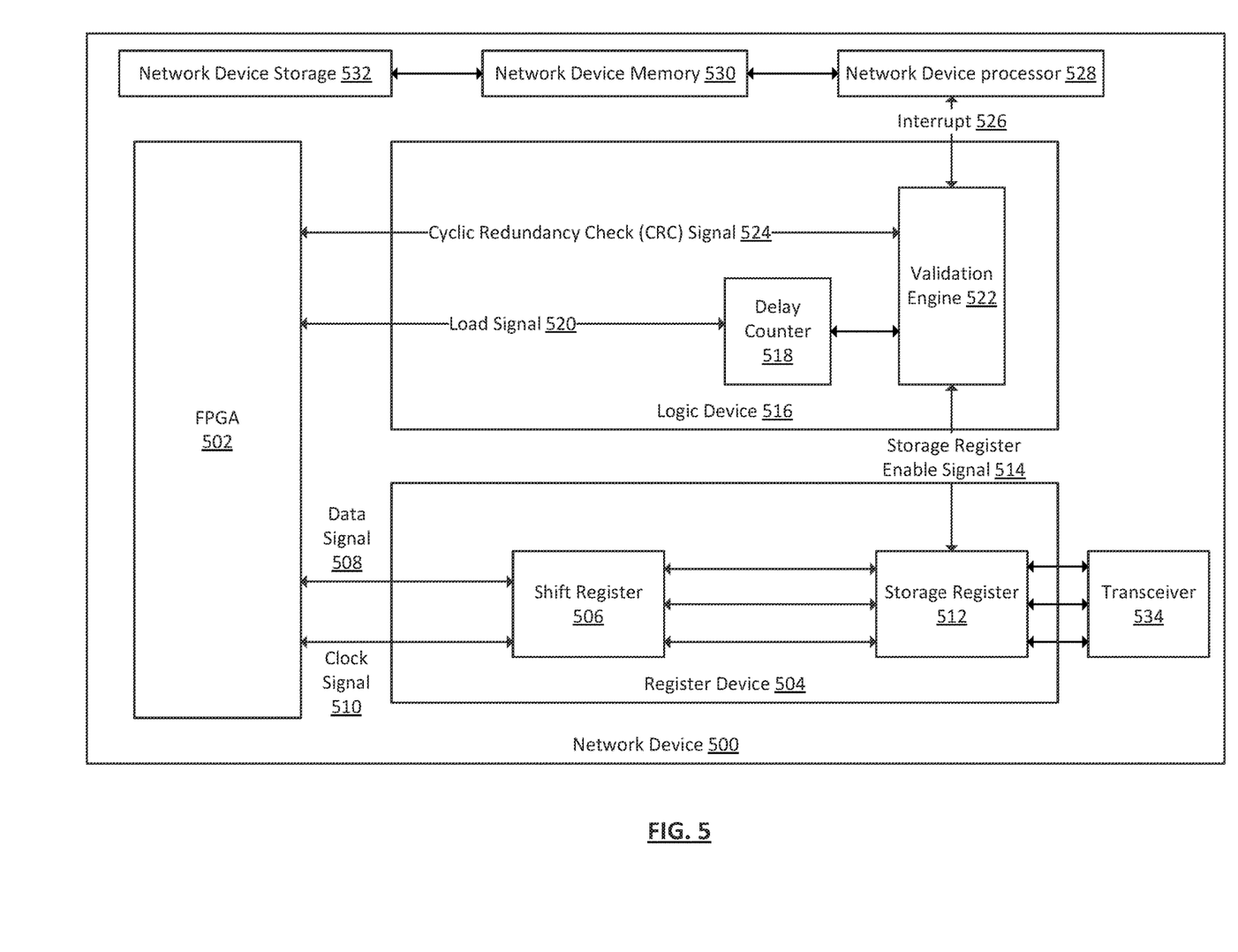
FIG. 5 shows an example in accordance with one or more embodiments of the invention.

FIG. 5 shows an example in accordance with one or more embodiments of the invention. The following example is for explanatory purposes only and not intended to limit the scope of the invention.

Referring to FIG. 5, consider a scenario in which a network device (500) includes an FPGA (502) for controlling a reset function of an optical transceiver (534). Inserted between the FPGA (502) and the transceiver (534) is a register device (504). The register device includes a shift register (506) (i.e., an initial state change device) operatively connected to the FPGA (502) and to a storage register (512) (i.e., a state hold device) also included in the register device (504). Outputs of the storage register (512) are coupled to inputs of the transceiver (534). The network device also includes a logic device (516) that includes a delay counter (518) and a validation engine (522). The delay counter (518) is coupled to a load signal (520) output of the FPGA (502) and to the validation engine (522). The validation engine (522) is operatively connected to storage register (512), to a network device processor (528), and to a CRC signal (524) output of the FPGA (502). The network device processor (528) is also operatively connected to network device memory (530) and network device storage (532).

In such a scenario, the FPGA (502) is configured to output a bit to the shift register (506) via a data signal (508) at each edge of a clock signal (510). Once eight bits have been shifted into the shift register (i.e., a state change has occurred), the FPGA sends a load signal (520) to the delay counter (518). The bits shifted into the shift register represent a state output from the FPGA (502). If the state 10101010 is shifted in and passed to the transceiver via the storage register, the transceiver resets.

At a first time, the FPGA has previously shifted in a state of 00100101 to the shift register. The state 00100101 has previously been validated (i.e., no CRC signal was received at the validation engine from the FPGA for a delay period counted by the delay counter and started after the state changed to 00100101 and the load signal was asserted by the FPGA), and thus the state output from the storage register (512) to the transceiver (534) is the logical state 00100101, which will not cause the transceiver to reset.

At a later time, after eight cycles of the clock signal (510), the state 10101010 has been shifted into the shift register (506), which is a state change. Based on the state change, the FPGA asserts a load signal (520) to a delay counter, which starts the delay counter (518) counting a delay period that is twice the CRC period of the FPGA (502).

In turn, the delay counter (518) indicates to the validation engine (522) that a count of a delay period has begun. The validation engine (522) thus monitors for a CRC signal (524) that, if asserted, is received from the FPGA (502). During the delay period, the state output from the storage register (512) to the transceiver (534) remains at logical state 00100101, meaning state 00100101 is held (because the storage register enable signal (514) has not yet been asserted by the validation engine (522)), even though the state being received at the inputs of the storage register (512) has changed to a logical state 10101010.

If the delay period passes and no CRC signal (524) is received by the validation engine (522) from the FPGA (502), then the state change has been validated and the storage register enable signal (514) is asserted, causing the storage register (512) to propagate the logical state 10101010 to its outputs and, thus, to the transceiver (534), causing the transceiver to reset, which has been validated as an intended action from the FPGA (502).

On the other hand, if a CRC signal (524) is received during the delay period (e.g., because an energetic particle has collided with the SRAM of the FPGA), then the state change cannot be validated, the storage register enable signal (514) is not asserted by the validation engine (522), and, thus, the state output from latch B remains a logical state 00100101 and the transceiver is not erroneously reset. Additionally, the validation engine (522) sends an interrupt (526) to the network device processor (528), alerting the network device processor that an error has been detected for the FPGA. In response, the network device processor may take any number of actions, such as obtaining the changed state (i.e., 10101010) from latch A, resetting the FPGA to correct the device logic error that was detected, logging the error, etc.

One having ordinary skill in the art, and the benefit of this Detailed Description, will appreciate that embodiments of the invention will, among other things, help mitigate the effects of SEUs for devices with logic stored in some form of SEU susceptible memory by providing a hard logic buffer that maintains a previous state for a delay period while also capturing a changed state, with the changed state not being propagated to other elements of a network device (e.g., one or more controlled devices) unless the detected state change has been validated by the lack of a received error detection signal for an appropriate tune period (e.g., two times the CRC period of an FPGA). Often, a network device processor receiving an alert based on detection of an error signal in a system without a logical buffer as described herein is unable to prevent the propagation of a bad, unknown, and/or unexpected changed state to one or more controlled devices given the speed and/or timing of the signals being sent to a controlled device, and the amount of tune required for the processor to react. Accordingly, in one or more embodiments of the invention, the prevention of the propagation of a bad, unknown, and/or unexpected changed state to one or more controlled devices by the logical buffer serves to prevent the propagation of such signals without relying on or waiting for the network device processor to perform an action.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for handling a single event upset (SEU), the method comprising:
    receiving, from a monitored device, a first data at a first input of an initial state change device;
    detecting, based on receiving the first data, a first state change;
    asserting, based on detecting the first state change, an initial state change device enable signal;
    transferring the first data from the first input to a first output of the initial state change device, wherein the first output is operatively connected to a second input of a state hold device;
    triggering, based on detecting the first state change, a delay counter to count a delay period;
    making, by a validation engine, a first determination that the delay period counted by the delay counter has expired without receipt of an error detection signal; and
    based on the first determination, asserting a state hold device enable signal to allow the first data to pass from the second input to a second output of the state hold device.

2. The method of claim 1, wherein:
    the second output is operatively connected to a controlled device, and
    the controlled device performs an action based on receiving the first data from the second output.

3. The method of claim 1, further comprising, after asserting the state hold device enable signal to allow the first data to pass from the second input to the second output of the state hold device:
    receiving, from the monitored device, a second data at the first input;
    detecting, based on receiving second data, a second state change;
    asserting, based on detecting the second state change, the initial state change device enable signal for the initial state change device to transfer the second data from the first input to the first output operatively connected to the second input;
    triggering, based on detecting the second state change, the delay counter to count the delay period;
    receiving, at the validation engine, while the delay counter is counting the delay period, the error detection signal;
    making a second determination, based on receiving the error detection signal, not to assert the state hold device enable signal, causing the second data not to be transferred from the second input to the second output, and the first data to be held at the second output; and
    sending an alert to a processor of a network device that that the error detection signal was received.

4. The method of claim 3, wherein:
    the second output is operatively connected to a controlled device, and
    the controlled device remains in a prior state based on not receiving the second data from the second output.

5. The method of claim 3, wherein the error detection signal is a cyclic redundancy check (CRC) asserted signal.

6. The method of claim 5, wherein a duration of the delay period is based on a multiple of a time for completing a CRC for the monitored device.

7. The method of claim 1, wherein:
    the initial state change device comprises a shift register, and
    detecting the first state change comprises detecting that a quantity of bits have been shifted into the shift register.

8. The method of claim 7, wherein:
    detecting that the quantity of bits have been shifted into the shift register is performed by the monitored device, and
    the initial state change device enable signal is a load signal asserted by the monitored device to the delay counter.

9. The method of claim 1, wherein:
    the initial state change device comprises a latch, and
    detecting the first state change comprises detecting, by a state comparator, a state change at a latch input of the latch.

10. A system for handling a single event upset (SEU), the system comprising:
    a monitored device comprising static random access memory (SRAM) comprising stored logic;
    an initial state change device operatively connected to the monitored device, comprising a first input and a first output, and configured to receive a first data from the monitored device at the first input;
a state hold device comprising a second input and a second output, wherein the second input is operatively connected to the first output;
a delay counter configured to count a delay period;
the state comparator operatively connected to the first input, the initial state change device enable input of the initial state change device, and the delay counter, and configured to:
  detect, based receiving the first data, a first state change;
  assert, based on detecting the first state change, an initial state change device enable signal for the initial state change device to transfer the first data from the first input to the first output; and
  trigger, based on detecting the first state change, the delay counter to count the delay period;
a validation engine operatively connected to the monitored device, the delay counter, and the state hold device, and configured to:
  make a first determination that the delay period counted by the delay counter expired without receipt, by the validation engine, of an error detection signal from the monitored device; and
  based on the first determination that no error detection signal was received during the delay period, assert a state hold device enable signal to allow the first data to pass from the second input to the second output of the state hold device.

11. The system of claim 10, further comprising:
a controlled device operatively connected to the second output and configured to perform an action based on receiving the first data from the second output.

12. The system of claim 11, wherein:
the initial state change device is further configured to:
  receive a second data from the monitored device at the first input; and
  transfer the second data from the first input to the first output based on receipt of the initial state change device enable signal from the state comparator,
the state comparator is further configured to:
  detect a second state change based on receiving the second data;
  assert, based on the detection of the second state change, the initial state change device enable signal;
  trigger the delay counter to count the delay period, and
the validation engine is further configured to, after asserting the state hold device enable signal to allow the first data to pass from the second input to the second output of the state hold device:
  receive, while the delay counter is counting the delay period, the error detection signal from the monitored device;
  make a second determination, based on receipt of the error detection signal, not to assert the state hold device enable signal, causing the second data not to be transferred from the second input to the second output, and the first data to be held at the second output; and
  send an alert to a processor of a network device that the error detection signal was received.

13. The system of claim 10, wherein the monitored device is one selected from a group of monitored devices consisting of a field programmable gate array (FPGA) and a complex programmable logic device (CPLD).

14. The system of claim 13, wherein the error detection signal comprises a cyclic redundancy check (CRC) assert signal sent by the FPGA to the validation engine.

15. The system of claim 10, wherein the monitored device is a component of a switch.

16. The system of claim 10, wherein the initial state change device comprises a first latch and the state hold device comprises a second latch.

17. The system of claim 10, wherein the monitored device, the initial state change device, the state hold device, the delay counter, the state comparator, the validation engine, and the controlled device are each included as a part of a network device.

18. A system for handling a single event upset (SEU), the system comprising:
a monitored device comprising static random access memory (SRAM) comprising stored logic;
an initial state change device operatively connected to the monitored device, comprising a first input and a first output, and configured to receive a first data from the monitored device at the first input;
a state hold device comprising a second input and a second output, wherein the second input is operatively connected to the first output;
a delay counter configured to:
  receive a first load signal from the monitored device when a first state change occurs; and
  count a delay period after receiving the first load signal;
a validation engine operatively connected to the monitored device, the delay counter, and the state hold device, and configured to:
  make a first determination that the delay period counted by the delay counter expired without receipt, by the validation engine, of an error detection signal from the monitored device; and
  based on the first determination, assert a state hold device enable signal to allow the first data to pass from the second input to the second output of the state hold device.

19. The system of claim 18, wherein:
the initial state change device is further configured to:
  receive a second data from the monitored device at the first input; and
  transfer the second data from the first input to the first output,
the delay counter is further configured to:
  receive a second load signal from the monitored device when a second state change occurs; and
  count the delay period after receiving the second load signal, and
the validation engine is further configured to:
  receive, while the delay counter is counting the delay period, the error detection signal;
  make a second determination, based on receipt of the error detection signal, not to assert the state change device enable signal, causing the second data not to be transferred from the second input to the second output, and the first data to be held at the second output; and
  send an alert to a processor of a network device that the error detection signal was received.

20. The system of claim 18, wherein the initial state change device comprises a shift register and the state hold device comprises a storage register.

21. The system of claim 20, wherein the monitored device, the initial state change device, the state hold device, the delay counter, the state comparator, the validation engine, and the controlled device are each included as a part of a network device.

* * * * *